(12) United States Patent
Chen et al.

(10) Patent No.: US 9,269,773 B2
(45) Date of Patent: Feb. 23, 2016

(54) HOLE DOPING OF GRAPHENE

(75) Inventors: Wei Chen, Singapore (SG); Zhenyu Chen, Singapore (CN); Thye Shen Andrew Wee, Singapore (SG); Lanfei Xie, Singapore (CN); Xiao Wang, Singapore (SG); Jiatao Sun, Singapore (SG); Ariando, Singapore (SG)

(73) Assignee: National University of Singapore, Singapore (SG)

( * ) Notice: Subject to any disclaimer, the term of this patent is extended or adjusted under 35 U.S.C. 154(b) by 0 days.

(21) Appl. No.: 13/696,189

(22) PCT Filed: May 5, 2011

(86) PCT No.: PCT/SG2011/000177
§ 371 (c)(1),
(2), (4) Date: Nov. 5, 2012

(87) PCT Pub. No.: WO2011/139236
PCT Pub. Date: Nov. 10, 2011

(65) Prior Publication Data
US 2013/0048952 A1    Feb. 28, 2013

Related U.S. Application Data

(60) Provisional application No. 61/343,886, filed on May 5, 2010, provisional application No. 61/404,975, filed on Oct. 12, 2010.

(51) Int. Cl.
| | | |
|---|---|---|
| *H01L 29/66* | (2006.01) | |
| *H01L 29/16* | (2006.01) | |
| *B82Y 30/00* | (2011.01) | |
| *B82Y 40/00* | (2011.01) | |

(Continued)

(52) U.S. Cl.
CPC ............ *H01L 29/1606* (2013.01); *B82Y 30/00* (2013.01); *B82Y 40/00* (2013.01); *C01B 31/0484* (2013.01); *H01L 29/6609* (2013.01); *H01L 29/861* (2013.01)

(58) Field of Classification Search
USPC ........... 257/E51.038, E51.04, 40, E21.09, 36; 438/158, 82, 99
See application file for complete search history.

(56) References Cited

U.S. PATENT DOCUMENTS

| | | | | |
|---|---|---|---|---|
| 8,278,643 | B2 * | 10/2012 | Bowers | H01L 21/2225 257/29 |
| 8,440,496 | B2 * | 5/2013 | Irvin | H01L 51/0096 257/103 |

(Continued)

FOREIGN PATENT DOCUMENTS

| | | |
|---|---|---|
| WO | WO-2010/030361 | 9/2009 |
| WO | WO 2009/158552 | 12/2009 |

OTHER PUBLICATIONS

Giovannetti et al., Doping Graphene with Metal Contacts, Jul. 11, 2008, Physical Review Letters, PRL 101, 026803 (2008).*

(Continued)

*Primary Examiner* — Jaehwan Oh
(74) *Attorney, Agent, or Firm* — Cesari and McKenna LLP

(57) ABSTRACT

An article includes a layer of graphene having a first work function; and a metal oxide film disposed on the layer of graphene, the metal oxide film having a second work function greater than the first work function. Electrons are transferred from the layer of graphene to the metal oxide film, forming a hole accumulation layer in the layer of graphene.

34 Claims, 15 Drawing Sheets

(51) Int. Cl.
*C01B 31/04* (2006.01)
*H01L 29/861* (2006.01)

(56) References Cited

U.S. PATENT DOCUMENTS

| | | | | |
|---|---|---|---|---|
| 8,698,226 | B2* | 4/2014 | Jain | H01L 29/66977 257/317 |
| 2005/0148137 | A1* | 7/2005 | Brask | H01L 21/823821 438/216 |
| 2008/0237533 | A1 | 10/2008 | Araujo Moreira et al. | |
| 2009/0020764 | A1 | 1/2009 | Anderson | |
| 2009/0155561 | A1 | 6/2009 | Choi | |
| 2010/0006823 | A1 | 1/2010 | Anderson | |
| 2010/0012176 | A1* | 1/2010 | Curtin | B82Y 10/00 136/255 |
| 2010/0025660 | A1* | 2/2010 | Jain | H01L 29/66977 257/24 |
| 2010/0096265 | A1 | 4/2010 | Colbert | |
| 2010/0109712 | A1 | 5/2010 | Zaliznyak | |
| 2010/0140723 | A1 | 6/2010 | Kurtz | |
| 2010/0200839 | A1* | 8/2010 | Okai | C23C 16/26 257/29 |
| 2011/0008926 | A1* | 1/2011 | Irvin | H01L 51/0096 438/82 |
| 2011/0042650 | A1* | 2/2011 | Avouris | H01L 29/1606 257/29 |
| 2011/0068290 | A1* | 3/2011 | Haddon | C12Q 1/6881 252/62.51 R |
| 2011/0070495 | A1* | 3/2011 | Ban | H01M 4/131 429/221 |
| 2011/0183180 | A1* | 7/2011 | Yu | H01G 11/36 429/128 |
| 2011/0186817 | A1* | 8/2011 | Bowers | H01L 21/2225 257/29 |
| 2012/0056161 | A1* | 3/2012 | Avouris | H01L 29/1606 257/24 |
| 2012/0153119 | A1* | 6/2012 | Patil | B82Y 30/00 250/200 |
| 2012/0178001 | A1* | 7/2012 | Zhang | H01M 4/133 429/405 |
| 2013/0202515 | A1* | 8/2013 | Haddon | B82Y 10/00 423/417 |
| 2013/0330559 | A1* | 12/2013 | Hellstrom | G06F 17/5009 428/408 |

OTHER PUBLICATIONS

Pinto, et al., "p-type doping graphene with F4-TCNQ" Journal of Physics: Condensed Matter, 2009, 21, 402001.
Choi, et al., "Chemical Doping of Epitacial Graphene by Organic Free Radicals", The Journal of Physical Chemistry Letters, 2010, 1 (2), 505-509.
Gierz, et al., "Atomic Hole Doping Graphene", Nano Letters, 2008, 8(12), 4603-4607.
Giovannetti, et al., "Doping Graphene with Metal Contacts", Physical Review Letters, 2002, 101(12), 026803.
Deffree, "One-step grapheme doping could enable grapheme CMOS transistors", News and New Products, Mar. 18, 2010.
Wang, et al., "Surface Transfer Doping of Diamond (100) by Tetrafluoro-tetracyanoquinodimethane", Journal of American Chemical Society, 2007, 129 (26), 8084-8085.
Ristein, et al., "Surface transfer doping of diamond", Journal of Physics D: Applied Physics, 2006, 39(4), R71.
Premlal, et al., "Surface intercalation of gold underneath a grapheme monolayer on SiC(0001) studied by scanning tunneling microscopy and spectroscopy", Applied Physics Letters, 2009, 94(26), 263115.
Berger, et al., "Ultrathin epitaxial graphite: 2D electron gas properties and a route toward graphene-based nanoelectronics", The Journal of Physical Chemistr, 2004, 108, 19912-16.
Norton, "Synthesis and properties of epitaxial electronic oxide thin-film materials", Materials Science and Engineering: R: Reports, 2004, 43(5-6), 139-247.
Chen, et al., "Surface transfer hole doping of epitaxial graphene using $MoO_3$ thin film", Applied Physics Letters, 2010.
Luxmi, et al., "Temperature-dependence of Epitaxial Graphene Formation on SiC(0001)", Journal of Electronic Materials, 31 (6), 2009.
Xie, et al., "Electrical Measurement of Non-destructively p-type Doped Graphene using Molybdenum Trioxide", American Institute of Physics, 2011.
Wang, et al., "N-Doping of Graphene Through Electrothermal Reactions with Ammonia", Science, 324, 786, 2009.
Cooke, "Graphene opens up to new possibilities on SiC", SemiconductorToday, 2, 10, 2007.
Suzanne Deffree; One-step graphene doping could enable graphene CMOS transistors; Mar. 18, 2010; Reed Business information, a division of Reed Elseveier Inc.
Zhenyu Chen, et al.,; Surface transfer hole doping of epitaxial graphene using MoO3 thin film; May 25, 2010; Applied Physics Letters 96, 213104 (2010)/American Institute of Physics.
B. Premlal, et Al.,; Surface intercalculation of gold underneath a graphene monolayer on Sic (0001) studied by scanning tunneling microscopy and spectroscopy; Jul. 2, 2009; Applied Physics Letter 94, 263115 (2009)/American Institute of Physics.
Lanfei Xie, et al.,; Electrical Measurement of Non-destructively p-type Doped Graphene using Molybdenum Trioxide; Department of Physics, National University of Singapore, Singapore 117542.
Dr. Mike Cookel Graphene opens up to new possibilities on SiC; Dec. 2007/Jan. 2008; semiconductorTODAY Compounds & AdvancedSilicon; vol. 2; Issue 10.
Dongchen Qi et al.,; Surface Transfer Doping of Diamond (100) by Tetrafouoro-tetracyanoquinodimethane; 2007; J. Am. Chwm. Soc. 2007, 129, 8084-8085.
Isabella Gierz, et al.,; Atomic Hole Doping of Graphene; Nov. 5, 2008; NANO Letters 2008 vol. 8, No. 12 4603-4607.
Junghun Choi, et al.,; Chemical Doping of Epitaxial Graphene by Organic Free Radicals; Dec. 28, 2009; The journal of physical chemistry letters 2010, 1, 505-509.
XinraN Wang, et al.,; N-Doping of Graphene Through Electrothermal Reactions with Ammonia;p. 2009; Science 324, 768; DOI: 10.1126/science. 1170335.
G. Giovannetti et al.,; Doping Graphene with Metal Contacts; Jul. 11, 2008; Physical Review Letter 101, 026803 (2008).

\* cited by examiner

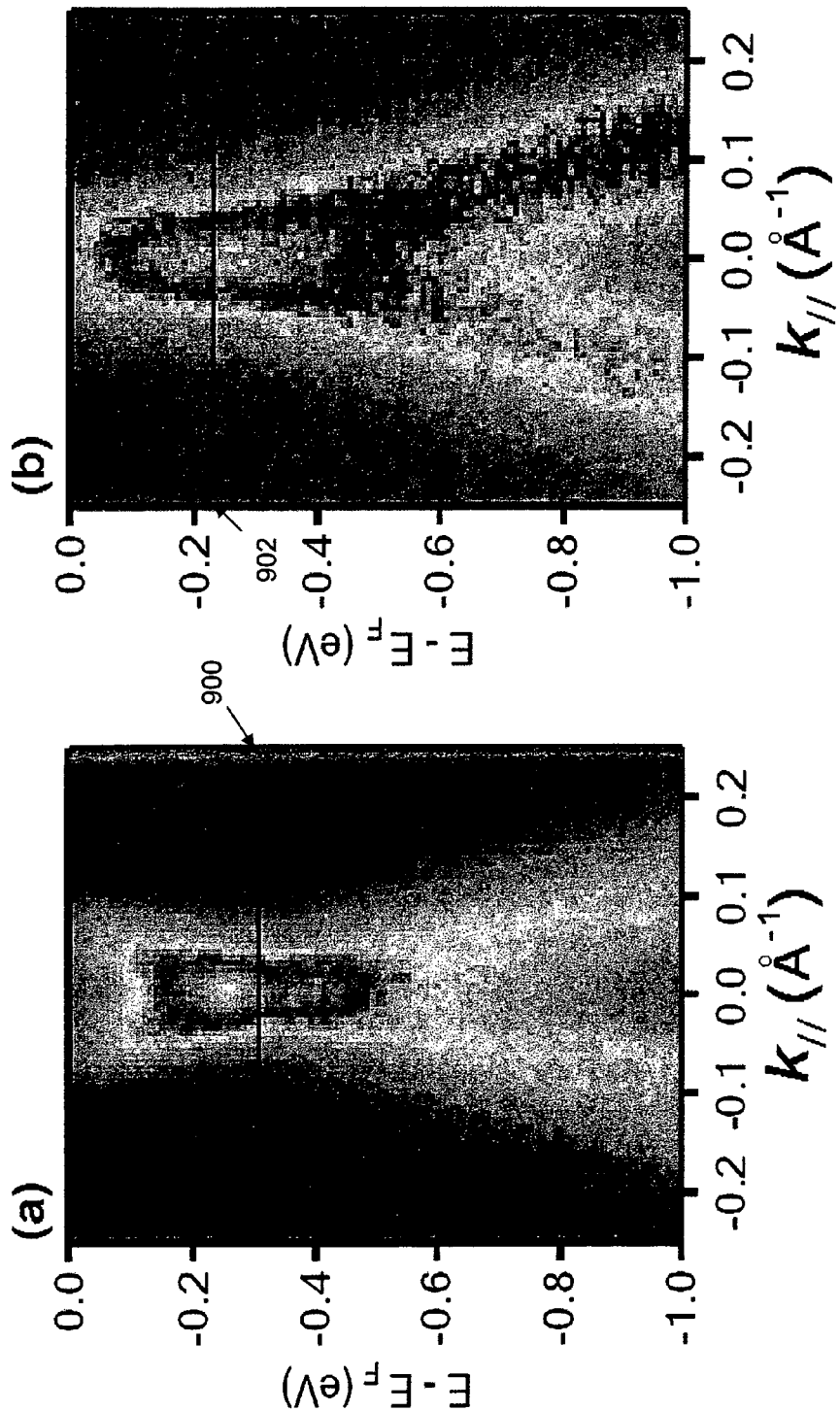

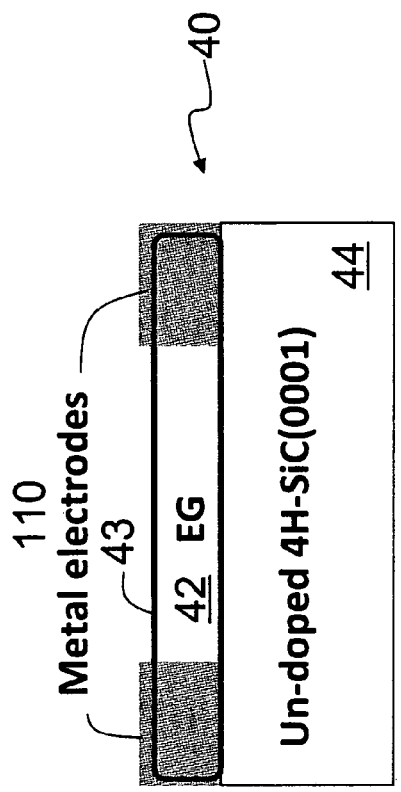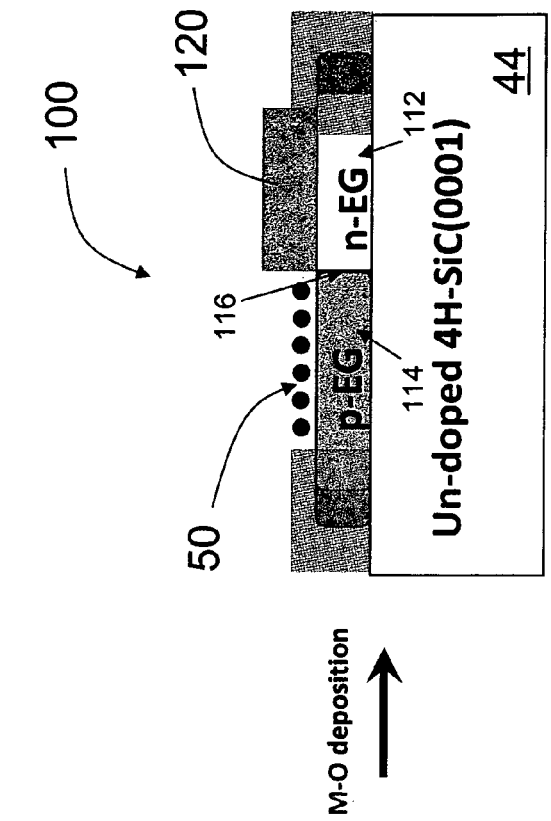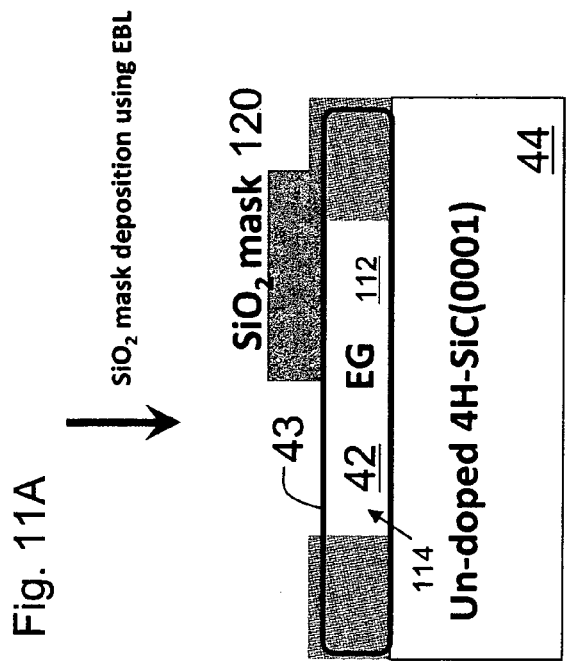
Fig. 11A
Fig. 11B
Fig. 11C

HOLE DOPING OF GRAPHENE

CROSS REFERENCE TO RELATED APPLICATION

This application is the national phase under 35 USC 371 of international application no. PCT/SG2011/000177, filed May 5, 2011, which claims the benefit of the priority date of U.S. patent provisional application No. 61/343,886, filed May 5, 2010 and U.S. patent provisional application No. 61/404,975, filed Oct. 12, 2010. The contents of the aforementioned applications are incorporated herein in their entirety.

BACKGROUND

Graphene is a monolayer of carbon atoms packed into a two-dimensional honeycomb lattice. Graphene exhibits exotic electronic properties originating from its linear band structure dispersion near the Dirac point and the extremely high charge-carrier mobility of both electrons and holes. Thermal decomposition of commercial silicon carbide (SiC) wafers can be used to produce high-quality single-crystalline epitaxial graphene (EG), enabling wafer-size graphene samples to be fabricated for device applications.

Precise control of the dopant carrier type and dopant concentration is important for the development of graphene-based nanoelectronic devices. Conventional doping methods such as ion implantation, which bombard a material with energetic dopant ions and then anneal the doped material, generally damage or destroy the graphene lattice and produce large numbers of defects, which degrade device performance.

Electron and/or hole transport in graphene-based field effect devices can be controlled by an externally applied bias voltage. Recently, effective surface transfer p-type (hole) doping of EG has been demonstrated by modifying the EG surface with a molecular species having strong electron withdrawing properties, such as tetrafluoro-tetracyanoquinodimethane (F4-CNQ). Alternatively, ultrathin metallic films with high electron affinity, such as bismuth, antimony, or gold, can be used to generate p-doped graphene.

SUMMARY

In a general aspect, an article includes a layer of graphene having a first work function; and a metal oxide film disposed on the layer of graphene, the metal oxide film having a second work function greater than the first work function. Electrons are transferred from the layer of graphene to the metal oxide film, forming a hole accumulation layer in the layer of graphene.

Embodiments may include one or more of the following.

The hole accumulation layer has an areal density of holes of up to about $1.0 \times 10^{13}$ cm$^{-2}$.

The article further includes a substrate, wherein the layer of graphene is disposed on the substrate. The layer of graphene is an epitaxial layer of graphene formed on the substrate.

The substrate comprises an n-type material. The substrate comprises silicon carbide.

The layer of graphene includes a first area and a second area adjacent to the first area; and wherein the metal oxide film is disposed only on the first area of the layer of graphene. A p-n junction is formed between the first area and the second area.

The article further includes a first electrode in contact with the first area of the layer of graphene and a second electrode in contact with the second area of the layer of graphene. The article further includes a source electrode formed on the layer of graphene; and a drain electrode formed on the layer of graphene and separated from the source electrode, wherein the metal oxide film is disposed between the source electrode and the drain electrode.

The metal oxide film comprises $MoO_3$ or $WO_3$.

The metal oxide film has a thickness of at least about 0.2 nm.

The layer of graphene exhibits ferromagnetic behavior. The degree of magnetic hysteresis exhibited by the layer of graphene is dependent on the thickness of the metal oxide film. The metal oxide film has a thickness less than about 15 nm. The metal oxide film has a thickness of about 5 nm.

In another general aspect, a method of doping graphene includes providing a layer of graphene having a first work function; and forming a metal oxide film on the layer of graphene, the metal oxide film having a second work function greater than the first work function. Electrons in the layer of graphene are transferred to the metal oxide film, forming a hole accumulation layer in the layer of graphene.

Embodiments may include one or more of the following.

The method further includes determining a thickness of the metal oxide film on the basis of a target concentration of holes in the hole accumulation layer.

Providing the layer of graphene includes forming the layer of graphene on a substrate. Forming the layer of graphene on a substrate includes forming an epitaxial graphene film on the substrate. Forming the layer of graphene on a substrate includes growing the layer of graphene by chemical vapor deposition.

Providing the layer of graphene includes forming the layer of graphene by micromechanical cleaving. Providing the layer of graphene includes forming the layer of graphene by reducing a graphene oxide.

Forming the metal oxide film includes forming the metal oxide film by a vacuum thermal deposition process. Forming the metal oxide film includes forming the metal oxide film by a layer-by-layer growth process.

In another general aspect, a photodetector includes a substrate; a layer of graphene disposed on a surface of the substrate, the layer of graphene having a first work function; a source electrode formed on the layer of graphene; a drain electrode formed on the layer of graphene and separated from the source electrode; and a metal oxide film disposed on the layer of graphene between the source electrode and the drain electrode, the metal oxide film having a second work function greater than the first work function. Electrons are transferred from the layer of graphene to the metal oxide film, generating an intrinsic electric field near an interface between the layer of graphene and the metal oxide film.

Embodiments may include one or more of the following.

A photocurrent is generated in the layer of graphene when incident photons are absorbed by the layer of graphene. The graphene is configured to absorb photons having a wavelength in the range from near-infrared to ultraviolet.

In a further general aspect, a device includes a substrate; a layer of graphene disposed on a surface of the substrate, the layer of graphene having a first work function, the layer of graphene having a first area and a second area adjacent to the first area; and a metal oxide film disposed on the first area of the layer of graphene, the metal oxide film having a second work function greater than the first work function. A p-n junction is formed between the first area and the second area.

Embodiments may include one or more of the following.

The device further includes a first electrode in contact with the first area of the layer of graphene and a second electrode in contact with the second area of the layer of graphene.

The substrate comprises n-type silicon carbide.

Electrons are transferred from the first area of the layer of graphene to the metal oxide film such that the first area is p-type. The second region of the layer of graphene is n-type. The second region of the layer of graphene is n-type due to charge transfer between the substrate and the second region of the layer of graphene.

The systems and methods described herein have a number of advantages. The use of a high work function metal oxide to dope graphene with excess holes is an effective, non-destructive doping technique that preserves the unique electronic properties of graphene. High work function metal oxide films have excellent thermal and chemical stability in air and solution; graphene devices containing such films are thus compatible with the harsh environmental conditions in standard lithography processes used to fabricate graphene-based nanoelectronic devices. Furthermore, these doping techniques are generalizable to the wafer-scale production of graphene-based electronics devices, such as graphene-based p-n junction diode rectifiers, graphene-based field effect transistors, and graphene-based photodetectors.

Other features and advantages of the invention are apparent from the following description and from the claims.

BRIEF DESCRIPTION OF DRAWINGS

FIGS. 9A and 9B are plots of the dispersion of π-bands for as-grown bilayer EG and EG with 0.2 nm $MoO_3$ deposited thereon, respectively, as measured by angle-resolved photo-emission spectroscopy measurements.

FIGS. 11A-11C are schematic diagrams illustrating the steps for forming a graphene-based p-n junction.

DETAILED DESCRIPTION

1 Hole Doped Graphene

Figure 1:
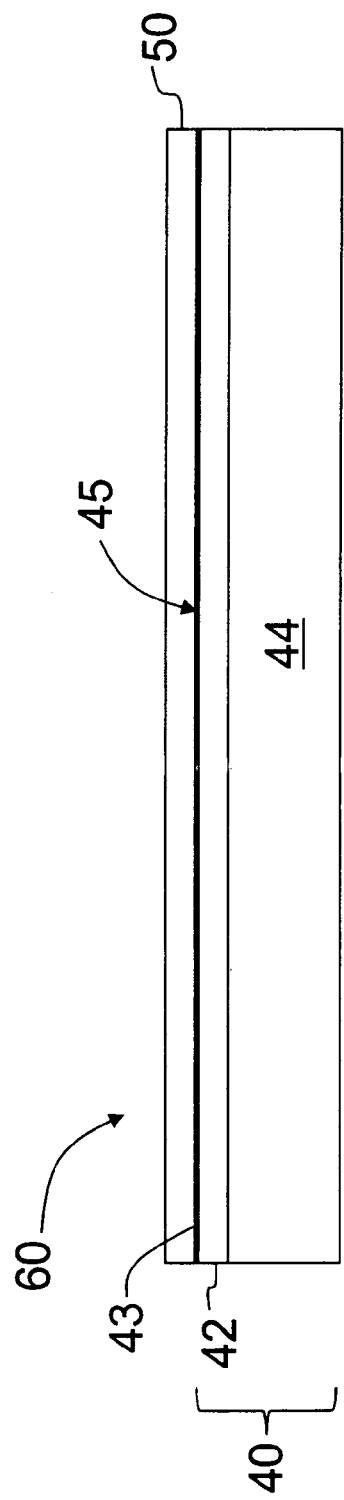
FIG. 1 is a schematic diagram of a structure including an epitaxial graphene (EG) film and a metal-oxide (M-O) film formed on a substrate.

Referring to FIG. 1, a thin film structure 60 includes an epitaxial graphene (EG) structure 40, formed of an EG film 42 on a substrate 44, such as a silicon carbide (SiC) wafer. EG film 42 may be a single graphene layer or may be formed of multiple layers of graphene. Thin film structure 60 also includes a metal-oxide (M-O) film 50 formed on a top surface 43 of EG film 42. M-O film 50 is a material with a high work function ϕ and that is chemically inert, thermally stable, and stable in air, such as $MoO_3$ (melting point ~780° C.) or $WO_3$.

Figures 2, 3:
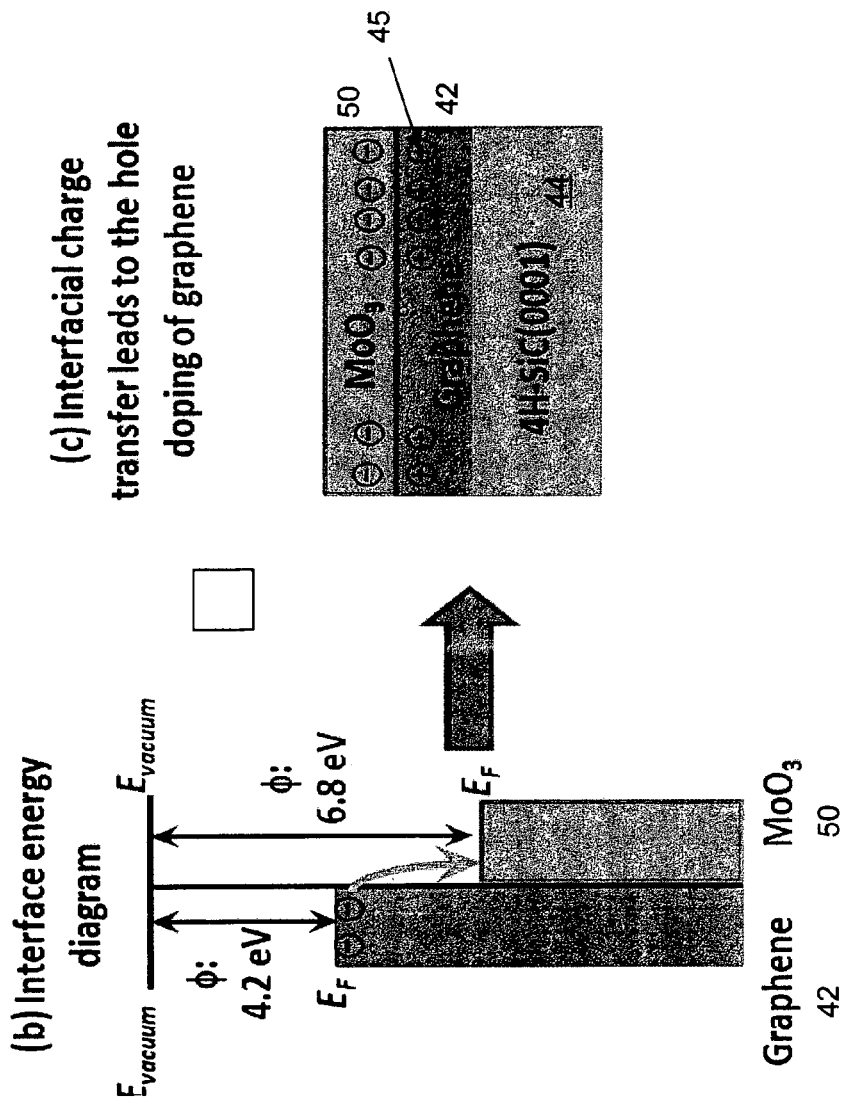
FIG. 2 is an interfacial energy diagram showing an interface between graphene and $MoO_3$.
FIG. 3 is a schematic diagram of interfacial charge transfer in the structure of FIG. 1.

Referring also to FIGS. 2 and 3, the work function $\phi_{EG}$ of EG film 42 is between about 4.0-4.3 eV (e.g., about 4.2 eV) and the work function $\phi_{M-O}$ of M-O film 50 is about 6.8 eV for $MoO_3$. The difference in work function between EG film 42 and M-O film 50 causes a spontaneous transfer of electrons from EG film 42 to M-O film 50 when these two materials are placed in physical contact. This transfer of electrons gives rise to a hole accumulation layer 45 at the top surface 43 of EG film 42, thus effectively hole doping (i.e., p-type doping) the EG film. The hole concentration in hole accumulation layer 45 depends on the thickness of M-O film 50. For instance, an areal density of holes of about $1.0 \times 10^{13}$ $cm^{-2}$ can be achieved with a 0.8 nm thick $MoO_3$ film.

Figure 4:
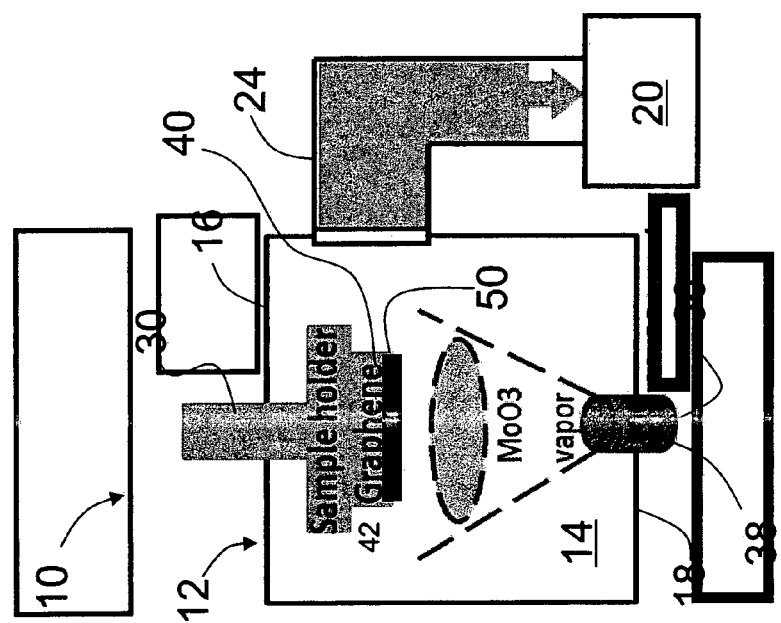
FIG. 4 is a schematic diagram of a deposition system.

Referring to FIG. 4, in some embodiments, M-O film 50 is formed by thermal evaporation in a thin film deposition system 10. In these embodiments, a vacuum pump 20 is pneumatically coupled to an interior 14 of a vacuum chamber 12 of deposition system 10 via a vacuum conduit 24. Vacuum pump 20 is sufficiently powerful to generate an ultrahigh vacuum (UHV) in interior 14 of vacuum chamber 12. A sample holder 30 is positioned in the interior 14 or at a top 16 of vacuum chamber 12 and holds EG structure 40 such that EG film 42 faces a thermal evaporator 36. Thermal evaporator 36 (e.g., a Knudsen cell ("K-cell")), located at a bottom 18 of vacuum chamber 12, holds an M-O powder 38. Thermal evaporator 36 evaporates M-O powder 38 to generate vaporized M-O clusters. The vaporized M-O clusters form M-O film 50 on the top surface 43 of EG film 42, thus generating thin film structure 60 (as shown in FIG. 1).

In some embodiments, uniform doping across large areas of EG film 42 can be achieved by performing layer-by-layer growth of a thin M-O film 50 on EG film 42. Layer-by-layer growth can be realized, for instance, by holding substrate 44 at a lower temperature during the growth of M-O film 50 in order to reduce the diffusion of M-O clusters, thus avoiding the formation of M-O islands.

Surface transfer hole doping can be extended to other types of graphene and other substrates, including, but not limited to, the following: SiC, Si, or highly ordered pyrolytic graphite (HOPG), which have a work function significantly different from that of the selected M-O; CVD graphene; micromechanical cleaved graphene; graphene-oxides; and reduced graphene film from graphene oxides. Surface modification can be performed using other high work function metal oxides, such as $WO_3$; or using organic molecules having strong electron withdrawing properties, such as F4-TCNQ or F48C60.

2 Experimental Results

To fabricate thin film M-O/EG structures 60 for spectroscopic evaluation, bilayer EG samples were prepared by thermal decomposition of a chemically etched n-type Si-terminated 4H—SiC (0001) sample (CREE Research, Inc., Durham, N.C.) at 1200° C. under UHV conditions. The quality of the resulting EG film was confirmed by in-situ low-temperature scanning tunneling microscopy, low-energy electron diffraction, and Raman spectroscopy. $MoO_3$ film 50 was evaporated in situ from a Knudsen cell onto the bilayer EG film at room temperature (~300 K) in vacuum chamber 14. The nominal deposition rate of 0.2 nm/min was precalibrated by a Quartz Crystal Microbalance and was further estimated by monitoring the attenuation in intensity of the Si 2p peak of bulk SiC before and after $MoO_3$ deposition.

Figure 5B:
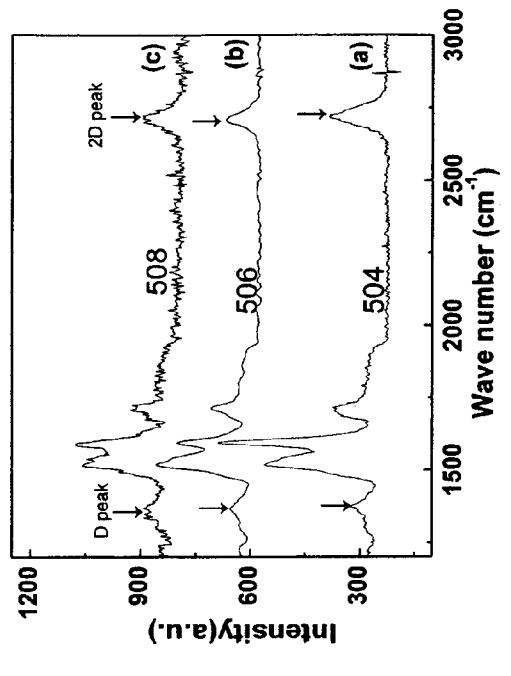
FIG. 5B is a plot of Raman spectra of pristine epitaxial graphene, graphene with 0.5 nm $MoO_3$, and graphene with 10 nm $MoO_3$ deposited thereon.
Figure 5A:
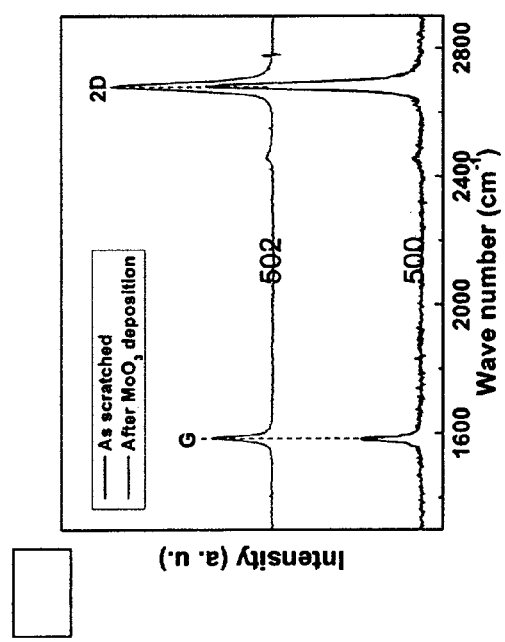
FIG. 5A is a plot of Raman spectra of exfoliated graphene and graphene with 5 nm $MoO_3$ deposited thereon.

Referring to FIGS. 5A and 5B, Raman spectroscopy measurements demonstrate that $MoO_3$ doping is physically non-destructive to the underlying EG film. Referring specifically to FIG. 5A, Raman measurements were performed on an exfoliated graphene structure before (curve 500) and after (curve 502) 5 nm $MoO_3$ deposition. The relative peak intensity of the 2D peak versus the G peak (i.e., the $I_{2D}/I_G$ ratio) remains almost constant before and after $MoO_3$ deposition. Furthermore, no D peak was observed. These spectra indicate that the graphene crystal structure is not disturbed. Referring now to FIG. 5B, Raman spectra of pristine epitaxial graphene (curve 504), graphene modified with 0.5 nm $MoO_3$ (curve 506), and graphene modified with 10 nm $MoO_3$ (curve 508) reveal that the defect peak increases in size only slightly with $MoO_3$ deposition. That is, the electronic properties of graphene are maintained after $MoO_3$ modification.

After the deposition of $MoO_3$ onto the EG film, the large work function difference between $MoO_3$ and EG leads to significant electron transfer from the EG film to $MoO_3$, as described above. This electron transfer induces the formation of a large interfacial dipole. Band bending occurs to align the Fermi level of the EG to the charge neutrality level of the $MoO_3$. These effects can be confirmed by measuring the vacuum level (VL) or work function change of the EG after $MoO_3$ deposition.

Figures 6, 7:
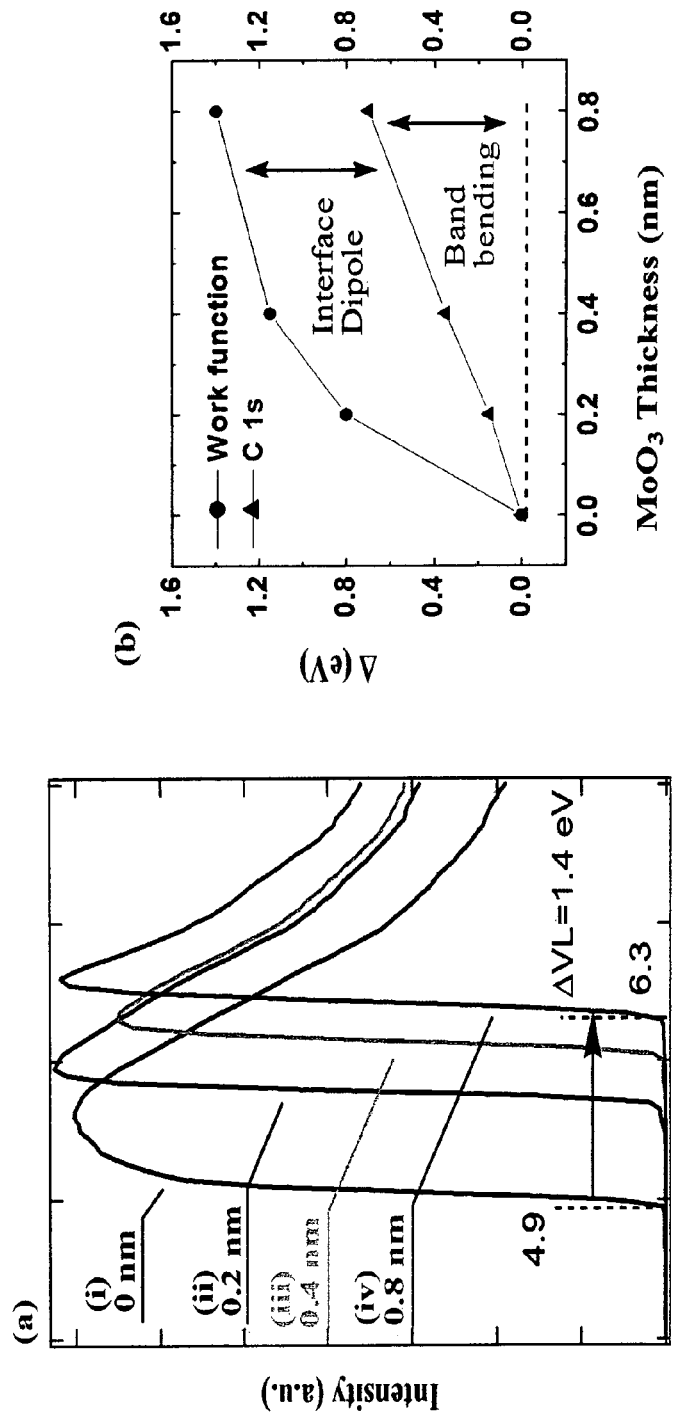
FIG. 6 is a plot of synchrotron photo-emission spectra showing kinetic energy (eV) versus intensity (arbitrary units) in the low-kinetic energy region of EG during deposition of $MoO_3$.
FIG. 7 is a plot of the shift in EG work function and the carbon 1s band bending in EG as a function of $MoO_3$ thickness.

Referring to FIG. 6, synchrotron-based in situ photo-emission spectroscopy (PES) experiments were carried out on a $MoO_3$/EG structure using a photon energy of 60 eV and a sample bias of −5 V. The evolution of the PES spectra in the low-kinetic energy region was observed during the deposition of $MoO_3$ onto EG. The VL and work function of the EG film were measured by linear extrapolation of the low-kinetic energy onset (secondary electron cut-off) in the PES spectra.

Referring to FIGS. 6 and 7, clean EG has a work function of 4.3±0.05 eV. After deposition of 0.2 nm (nominal thickness) of $MoO_3$, the work function increased to 5.1±0.05 eV; that is, the VL shifted upwards by 0.8±0.05 eV. The work function shift increased to 1.4±0.05 eV for a nominal $MoO_3$ thickness of 0.8 nm. The change in EG work function as a function of $MoO_3$ thickness is shown in FIG. 7.

Figure 8A:
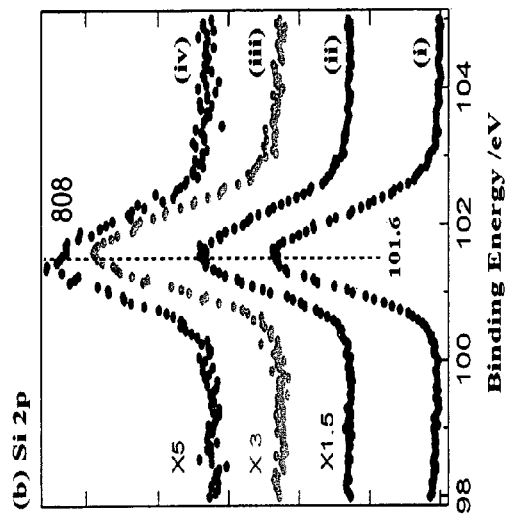
FIGS. 8A-8C are plots of photo-emission spectra for C 1s, Si 2p, and Mo 3d orbitals, respectively, as a function of $MoO_3$ thickness on EG.
Figure 8B:
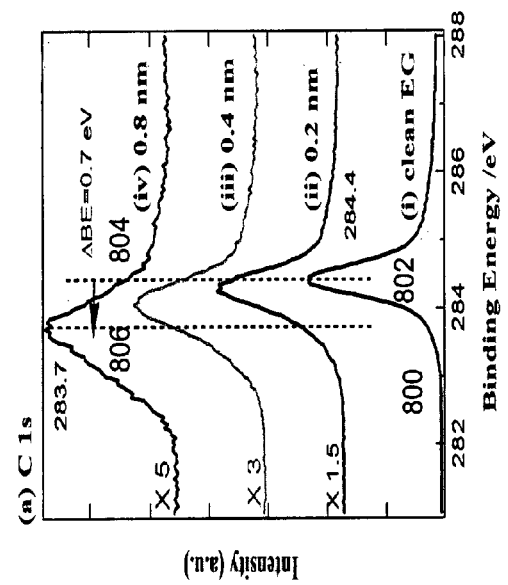
Figure 8C:
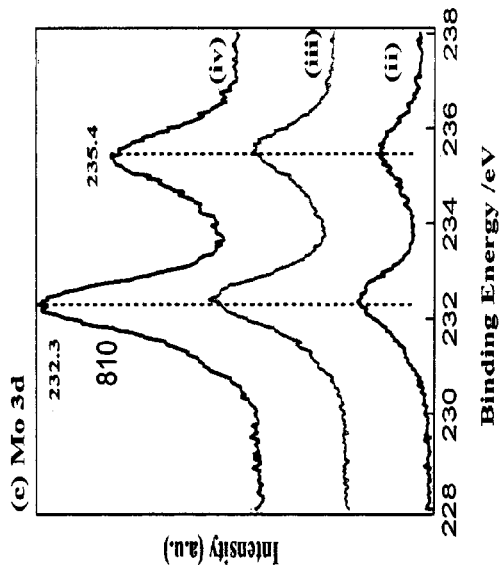

Referring to FIGS. 8A-8C, the PES spectra as a function of $MoO_3$ thickness on EG are shown for the C 1s band (FIG. 8A), the Si 2p band (FIG. 8B), and the Mo 3d band (FIG. 8C). Referring specifically to FIG. 8A, the C 1s spectrum of clean EG (curve 800) is dominated by the EG-related C 1s peak 802 centered at a binding energy of 284.4±0.05. As $MoO_3$ is deposited, the C 1s peak gradually shifts toward lower binding energy. For a nominal $MoO_3$ thickness of 0.8 nm (curve 804), the EG-related C 1s peak 806 is shifted by 0.7 eV to 283.7±0.05 eV. The shift in the C 1s band is also shown in FIG. 7.

The shift of the C 1s peak can be explained by the upward band-bending (i.e., p-type doping) of EG upon deposition of $MoO_3$. Charge transfer at the $MoO_3$/EG interface results in the accumulation of excess delocalized holes in the EG film, effectively doping the EG with holes. As a result of this hole doping, the Fermi level of EG shifts towards or even below the valence band of EG. The observed large VL shift of 1.4 eV (shown in FIGS. 6 and 7) originates from the convolution of upward band-bending (0.7 eV; shown in FIG. 8A) and the interfacial dipole formed at the $MoO_3$/EG interface.

In contrast, referring to FIG. 8B, no shift in the binding energy of the bulk SiC-related Si 2p peak 808 was observed. The stability of the Si 2p peak indicates that there is no significant charge transfer at the SiC/EG interface during $MoO_3$ deposition and that holes are largely confined in the two-dimensional EG layer. More specifically, the wide band gap of n-type 4H—SiC (3.2 eV) acts as a high energy barrier (>2.5 eV) that prevents holes from transferring from the EG Fermi level to the valence band of the SiC, thus facilitating confinement of the holes in the EG layer.

Referring to FIG. 8C, the Mo $3d_{5/2}$ core level peak 810 is centered at a binding energy of 232.3±0.05 eV throughout deposition, indicating that the Mo is in the $Mo^{6+}$ form in fully oxidized $MoO_3$.

Referring to FIGS. 9A and 9B, the surface transfer p-type doping of EG was further confirmed with angle-resolved photo-emission spectroscopy (ARPES) using a Scienta (Newburyport, Mass.) R4000 electron spectrometer. FIGS. 9A and 9B show the dispersion of π-bands, as measured at room temperature by ARPES with a photon energy of 60 eV, of as-grown bilayer EG on 4-H SiC (0001) and after deposition of 0.2 nm $MoO_3$, respectively.

ARPES measurements show the valence band structure around the $\vec{K}$ point of the EG Brillouin zone. Due to charge transfer from the SiC substrate, the as-grown bilayer EG on SiC (FIG. 9A) is electron-doped (i.e., n-type), with the Fermi level located 0.32 eV above the Dirac point, as shown by a marker 900. After deposition of 0.2 nm $MoO_3$ (FIG. 9B), the Dirac point shifts towards the Fermi level by 0.1 eV, as shown by a marker 902, suggesting an upward band-bending induced by $MoO_3$ deposition. This result is consistent with the C 1s core-level shift shown in FIG. 8A.

Based on the linear dispersion of the density of states (DOS) near the Dirac point (within 1 eV), the charge carrier concentration (electron or hole) of doped graphene can be estimated using the following equation:

$$N_e N_h = \frac{1}{\pi (\hbar v_F)^2} (|E_F - E_D|)^2,$$

where $N_e$ ($N_h$) is the areal density of electrons (holes), $v_F \approx 10^6$ m/s is the Fermi velocity of graphene, and $E_F$ ($E_D$) is the energy position of the Fermi level (Dirac point).

Figure 10:
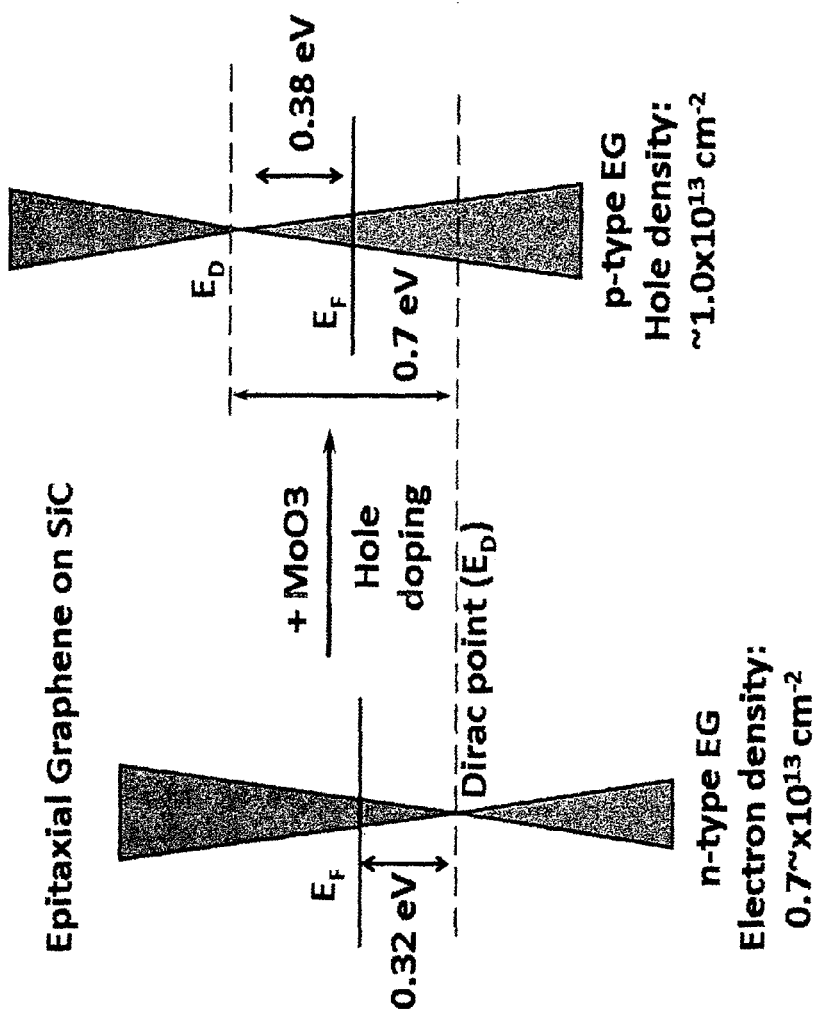
FIG. 10 shows schematic energy level diagram of as-grown (n-type) EG and p-type EG having 0.8 nm $MoO_3$ deposited thereon.

Referring to FIG. 10, the Dirac point of as-grown n-type EG is about 0.32 eV below the Fermi level, and the areal density of electrons in the as-grown bilayer EG is about $0.7 \times 10^{13}$ $cm^{-2}$, as estimated from the above equation. After the deposition of 0.8 nm $MoO_3$ on the bilayer EG, the surface transfer p-type doping of EG lifts the graphene band by 0.7 eV, and hence the Fermi level moves to 0.38 eV below the Dirac point. Based on the above equation, the areal density of holes in EG with 0.8 nm $MoO_3$ deposited thereon is estimated to be about $1.0 \times 10^{13}$ $cm^{-2}$; that is, EG is hole doped via surface modification with a thin $MoO_3$ film.

3 Graphene-Based p-n Junction

As-grown EG on SiC is n-type due to interfacial charge transfer between EG and SiC. As demonstrated above, the deposition of a thin M-O film on the EG surface induces p-type doping in the EG. Accordingly, surface transfer doping methods can be used to fabricate graphene-based p-n junction devices.

Referring to FIGS. 11A-11C, a graphene-based p-n junction is fabricated on an undoped 4H—SiC (0001) substrate 44. EG structure 40 is prepared as described above, forming a layer of epitaxial graphene 42 on SiC substrate 44. This EG layer 42 is n-doped due to charge transfer from the SiC substrate. Two metal electrodes 110 are formed on EG film 42, e.g., using conventional thin film metallization processes.

A mask 120 is deposited over a first area 112 of EG film 42 between the electrodes 110, leaving a second area 114 of EG film 42 exposed. In some embodiments, mask 120 is a $SiO_2$ mask formed by electron beam lithography.

M-O film 50 (e.g., a $MoO_3$ film) is deposited onto the top surface of the structure, contacting only the second (unmasked) area 114 of EG film 42. Surface charge transfer between the EG in unmasked second area 114 and the M-O film 50 causes unmasked area to be p-type. A p-n junction 116 is thus generated between first (n-type) area 112 and second (p-type) area 114. The mask can be removed using standard photolithographic processes.

4 Graphene-Based Photodetectors

One atomic layer of graphene is capable of absorbing about 2% of incident light in the visible to infrared (IR) range. Indeed, the strength of the interband transition in graphene is one of the largest of all known materials. In combination with the high charge carrier mobility of graphene, graphene becomes an attractive candidate for infrared photodetectors. However, photo-induced electron/hole pairs in graphene generally recombine on a timescale of tens of picoseconds, rendering negligible the overall induced photocurrent.

Figure 12A:
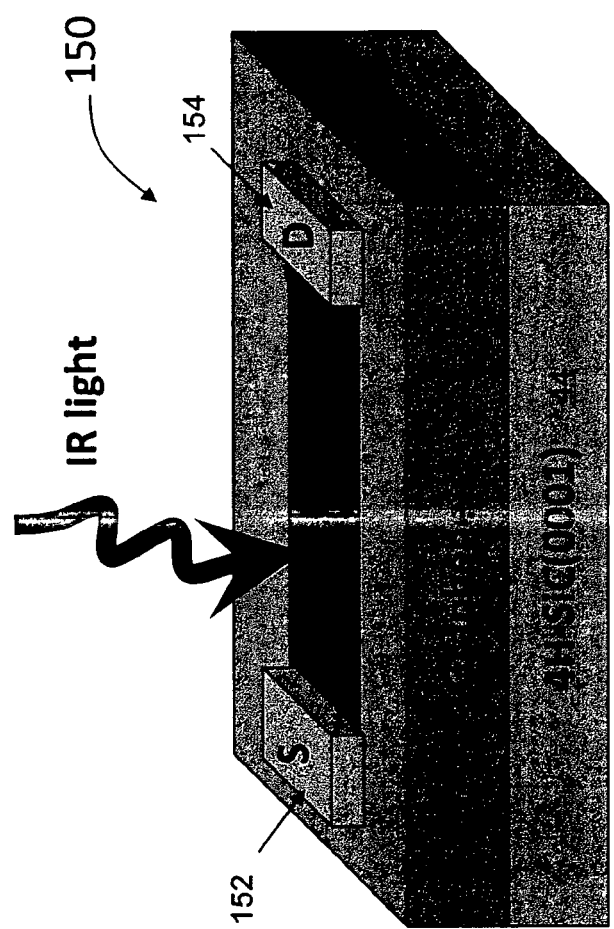
FIGS. 12A and 12B are schematic diagrams of a graphene-based photodetector.
Figures 12B, 12C:
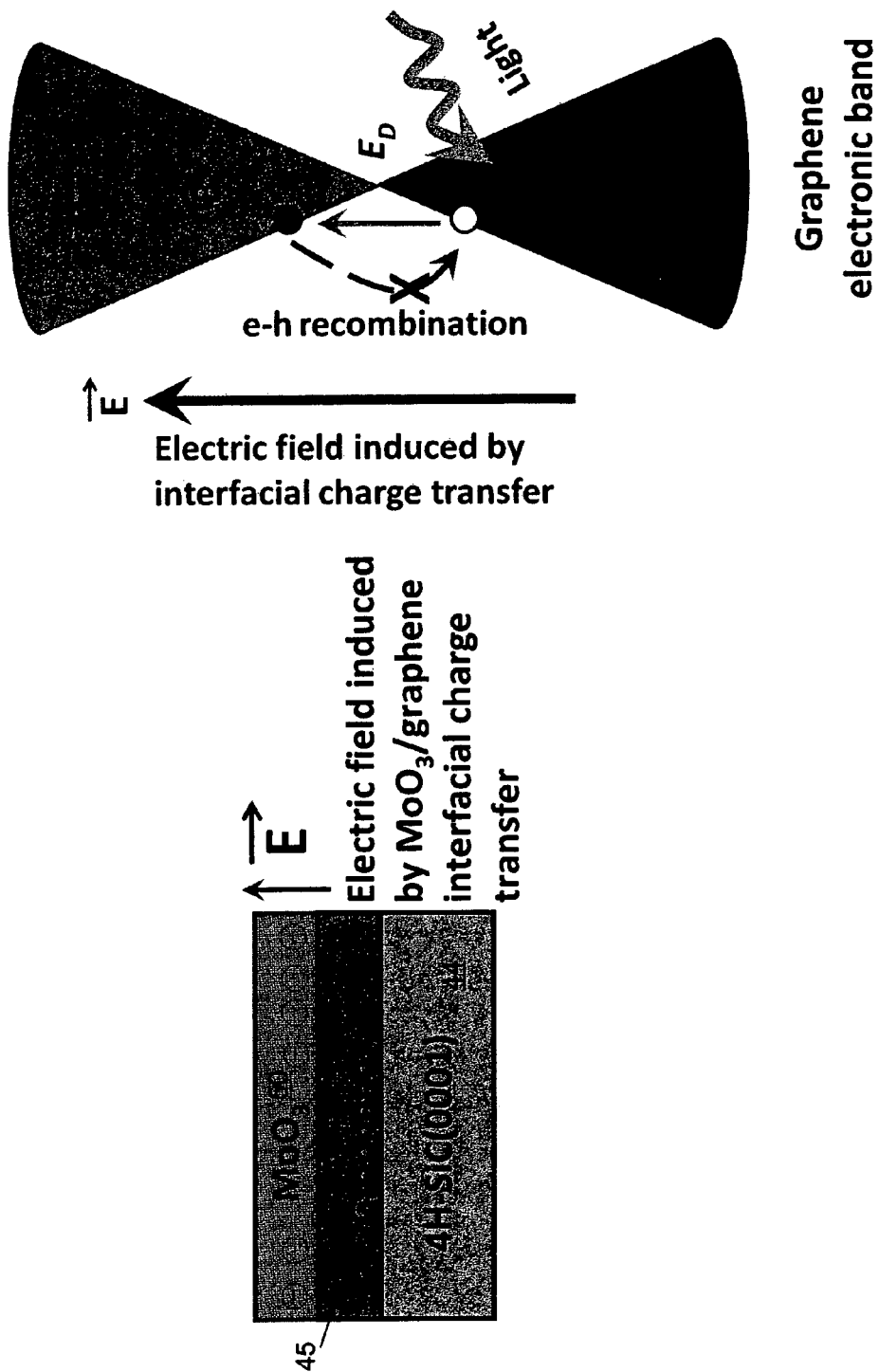
FIG. 12C is a schematic diagram of the electronic band structure of graphene in the graphene-based photodetector of FIG. 12A.

Referring to FIGS. 12A-12C, a graphene-based photodetector 150 makes use of the surface charge transfer principles described above. A thin film structure formed of EG and M-O on an SiC substrate is formed according to methods discussed above. A source 152 and a drain 154 region are formed at respective ends of the M-O film, e.g., by conventional patterning techniques.

Charge transfer at the M-O/EG interface induces a strong intrinsic electric field at the interface between these two films. When photodetector 150 is irradiated with light, e.g., IR light, electron/hole pairs are generated in the EG layer. The induced electric field at the M-O/EG interface efficiently separates photo-induced electron/hole pairs, slowing the recombination rate and generating a non-zero photocurrent. Further improving the photodetection capability of photodetector 150, the M-O film has a band gap (e.g., for $MoO_3$, the band gap is ~2 eV) such that the M-O film is transparent to near-IR photons. In some embodiments, the range of the photodetector can be extended such that light can be detected from the near-IR through the ultraviolet.

5 Ferromagnetism in M-O Modified Graphene

The surface modification of EG induces room temperature ferromagnetism in the graphene layer. For magnetic measurements, an EG film was prepared as described above. $MoO_3$ was thermally evaporated from a K-cell onto the EG film under UHV conditions at 800 K. Magnetic momentum was detected by superconducting quantum interference devices (SQUIDs) with a sensitivity of $10^{-8}$ emu.

Figures 13A, 13B:
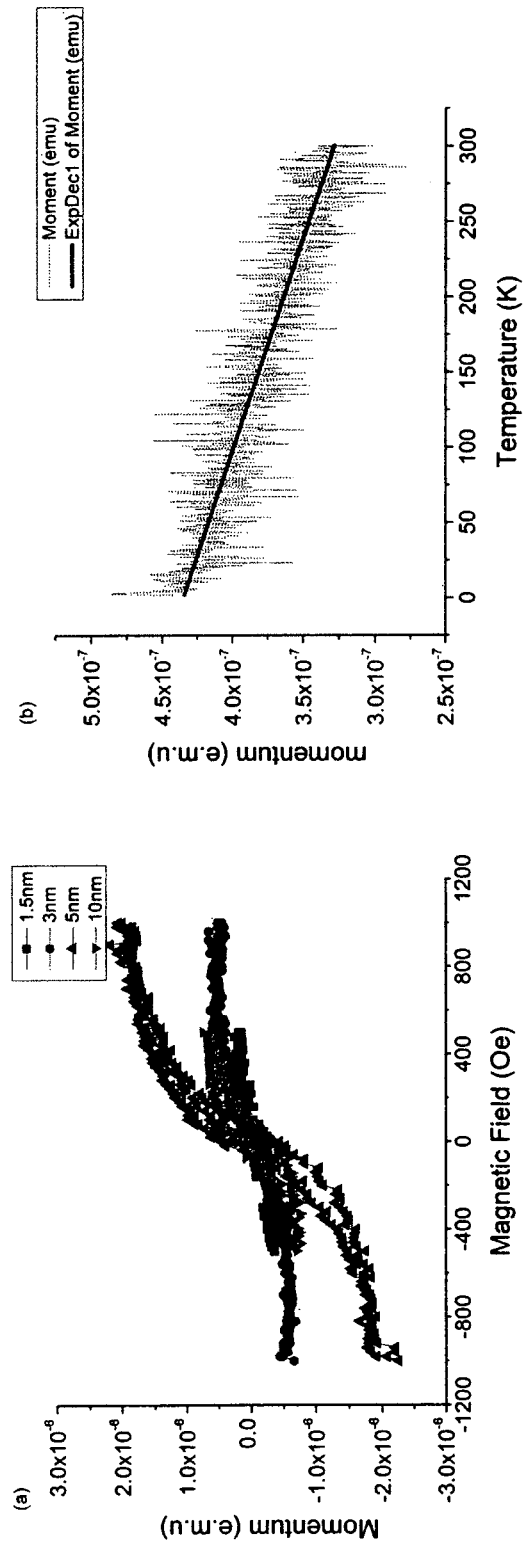
FIG. 13A is a plot of magnetic momentum of graphene versus magnetic field for different thicknesses of deposited $MoO_3$ at room temperature after subtracting background.
FIG. 13B is a plot of magnetic momentum at different temperatures for one of the samples of FIG. 13A.

Referring to FIG. 13A, SQUID measurements reveal a robust room temperature magnetization hysteresis loop which indicates ferromagnetism in the EG film. The coercivity and saturation magnetization depend on the thickness of the $MoO_3$ film. The hysteresis loop increases in size with increases $MoO_3$ thickness until reaching a maximum at 5 nm $MoO_3$. Beyond this thickness, the ferromagnetism weakens, and disappears for $MoO_3$ thicknesses greater than about 15 nm. At 5 nm $MoO_3$, the magnetization momentum per benzene ring reaches 10 Bohr magnetons; by comparison, the magnetization moment for one iron atom is 2.2 Bohr magnetons. The observed magnetization moment of 10 Bohr magnetons is at least three orders of magnitude larger than defect-generated ferromagnetism in graphene oxide. Referring to FIG. 13B, in a plot of magnetic momentum versus temperature, it can be seen that the Curie temperature is greater than 400 K. SQUID measurements confirm that pure $MoO_3$ powder does not shown any ferromagnetic behavior, excluding the possibility that the observed ferromagnetic behavior is due to $MoO_3$ alone.

Without being limited to the following explanation, it is believed that the interfacial charge transfer between graphene and the high work function M-O leads to the formation of unpaired electrons in graphene. The electronic spins of these unpaired electrons align under the large intrinsic electric field that is generated by the interfacial charge transfer, thus causing ferromagnetic behavior at room temperature.

Room temperature ferromagnetism in graphene can be exploited for use in graphene-based electronic devices, e.g., for information storage. For instance, for the fabrication of micro- or nano-scale electronic devices with applications in massive data storage, EG may be patterned into small areas, e.g., using standard lithography techniques. Doping uniformity in these small graphene domains can be achieved by layer-by-layer growth of M-O, which can be realized through precise control over the M-O growth process.

In some embodiments, defective graphene and patterned zigzag graphene also exhibit ferromagnetic properties.

6 Quantum Hall Effect in p-Doped Graphene

The p-type doping of EG via M-O deposition leads to the downward shift of the Fermi level toward the valence band. At the same time, the doped graphene retains its high charge carrier mobility, thus facilitating observation of the quantum Hall effect.

Figure 14:
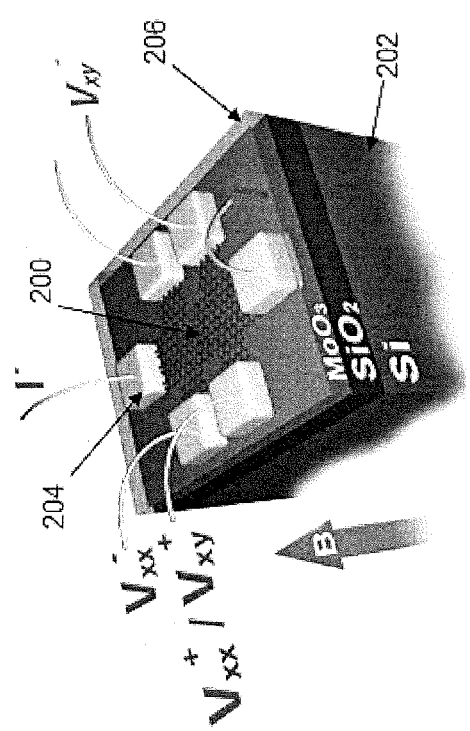
FIG. 14 is a schematic diagram of an M-O/EG sample for electrical transport measurements.

Referring to FIG. 14, for electrical transport measurements, mechanically exfoliated single layer graphene flakes 200 were deposited on a $SiO_2$/Si substrate 202. A Hall-bar structure (5 μm×3 μm) was patterned by standard electron-beam lithography, using Cr/Au (5/30 nm) as metal contacts 204. The patterned sample was annealed at 200° C. to remove residue from a poly(methyl methacrylate) (PMMA) resist. A 5 nm film 206 of $MoO_3$ was then thermally evaporated from a Knudsen cell in a UHV chamber at room temperature.

Transport measurements were carried out in a physical properties measurement (PPMS) on the same graphene device before and after $MoO_3$ deposition. A small alternating current ($I_{sd}$=100 nA) was applied through the device. The transverse voltage (i.e., the Hall voltage, $V_{xy}$) and the longitudinal voltage ($V_{xx}$) were measured during a magnetic field sweep (−9 T to 9 T) at 2K.

Figures 15A, 15B:
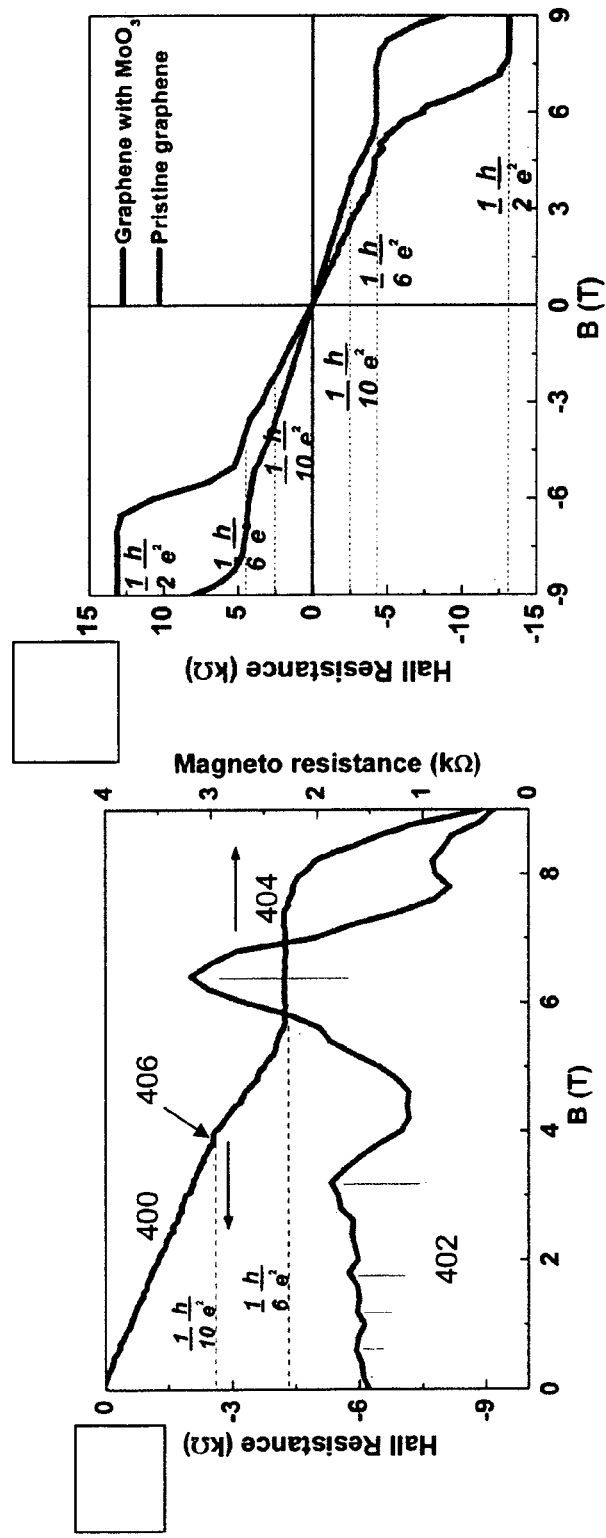
FIG. 15A is a plot of the Hall resistance $R_{xy}$ and the magnetoresistance $R_{xx}$ of $MoO_3$-modified graphene as a function of magnetic field.
FIG. 15B is a plot of the Hall resistance of pristine graphene and graphene modified with 5 nm $MoO_3$ as a function of magnetic field at 2 K.

Referring to FIG. 15A, the Hall resistance $R_{xy}$ and the magnetoresistance $R_{xx}$ of $MoO_3$-modified graphene is shown as a function of magnetic field. At low magnetic field, the Hall resistance develops linearly with the field B (region 400). The charge carrier density is calculated from the Hall resistance slope by the following equation:

$$n = \frac{1}{e}\frac{dR_{xy}}{dB}.$$

After MoO$_3$ deposition, the charge carrier density n reaches 1×10$^{12}$ cm$^{-2}$ and the charge carrier type is holes, indicating p-type doping.

Based on this charge carrier density, the hole mobility can be obtained by the following equation:

$$\mu = \frac{L}{W}(enR_{xx})^{-1},$$

where L and W represent the length and width of the Hall bar geometry. In this case, the mobility in MoO$_3$ doped graphene is determined to be 7300 cm$^2$ V$^{-1}$ s$^{-1}$ at 2 K and 6150 cm$^2$ V$^{-1}$ s$^{-1}$ at 300 K. These mobilities are slightly smaller than hole mobilities in pristine graphene (8700 cm$^2$ V$^{-1}$ s$^{-1}$ at 2 K and 7300 cm$^2$ V$^{-1}$ s$^{-1}$ at 300 K). This mobility reduction may be ascribed to defect scattering induced by MoO$_3$ particles sitting on the graphene surface.

Although the hole mobility is reduced in doped graphene, the mobility is still sufficiently large to allow for the observation of the quantum Hall effect (QHE). Apart from the presence of Shubnikov-de Hass (SdH) oscillations 402 in the magnetoresistance R$_{xx}$, a prominent quantum Hall (QH) plateau 404 and a small QH plateau 406 are seen in the Hall resistance, features which are hallmarks of the QHE.

In a two-dimensional electron system, the Hall resistance possesses quantized values of h/(e$^2$υ), where υ is the integer filling factor. However, in single layer graphene, the QHE is different from the conventional QHE: half-integer quantization is observed, with half-integer quantization values expressed as $$R_{xy}^{-1} = \pm 4\left(n + \frac{1}{2}\right)\frac{e^2}{h},$$

where n is the Landau levels (LL) index and the four-degeneracy is caused by both spin and sublattice degeneracy. From this expression, it can be determined that the two plateaus observed in the positive magnetic field represent n=−1 and n=−2 (corresponding to υ=−6 and υ=−10), respectively, where the minus sign indicates hole-like LL. The well-defined quantum Hall states suggest that MoO$_3$-doped graphene retains the high mobility and other unique electronic properties of pristine graphene. This result is consistent with the Raman spectroscopy results (discussed above) that confirm the non-destructivity of p-type MoO$_3$ surface modification doping.

Referring to FIG. 15B, as compared with pristine graphene, the positions of the resistance plateaus of MoO$_3$-modified graphene are shifted to higher magnetic field. This shift is likely caused by the change in Fermi level (E$_F$) position, which is a determinant factor for the positions of QH plateaus. In graphene, the Hall resistance R$_{xx}$ exhibits plateaus at magnetic fields for which an integer LL is fully occupied. That is, for instance, if E$_F$ is located between the LL n and the LL n+1, then when E$_F$ moves across a LL, R$_{xx}$ jumps by an amount equal to 4e$^2$/h. Thus, the position of a plateau can be adjusted by tuning E$_F$ and the LL energy, which is given by $$E_n = \text{sng}(n)\sqrt{2ev_F^2 n|B}.$$

The LL energies for MoO$_3$-modified graphene are identical to those for pristine graphene at any given magnetic field. Thus, the shift in QH plateau positions can be ascribed to the shift in E$_F$ as a result of MoO$_3$ deposition. MoO$_3$ modification, and the resulting p-type doping of the graphene, shifts E$_F$ away from the Dirac point, hence causing the position of the QH plateaus to move toward a larger magnetic field.

7 Effect of Air Exposure on Doping Level

Figure 16:
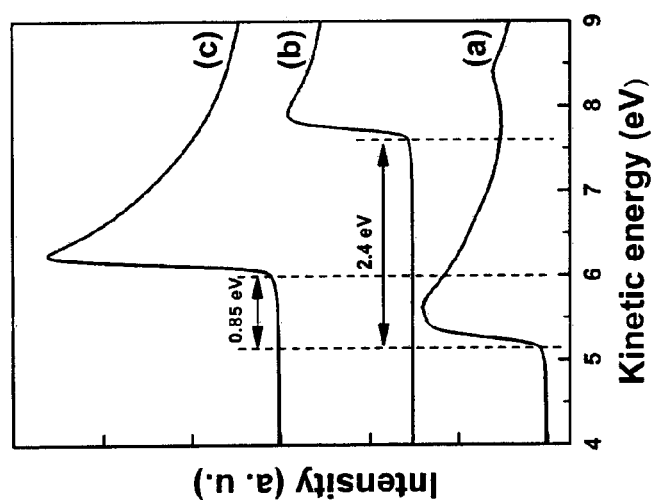
FIG. 16 is a plot of low-kinetic energy ultraviolet photoelectron spectroscopy spectra of pristine chemical vapor deposition graphene, graphene with 5 nm $MoO_3$ deposited thereon, and graphene with 5 nm $MoO_3$ deposited thereon and exposed to air for 2 hours.

Referring to FIG. 16, in order to investigate the effect of exposure to air on the doping level of M-O modified graphene, an in situ ultraviolet photoelectron spectroscopy (UPS) study was conducted on MoO$_3$-modified graphene. The plot of FIG. 16 shows UPS spectra in the low-kinetic energy region for a sample pristine CVD graphene (curve (a)) and a sample of 5 nm (nominal thickness) MoO$_3$ deposited under UHV conditions on CVD graphene before (curve (b)) and after (curve (c)) exposure to air for 2 hours. The vacuum level (VL) was measured by linear extrapolation of the low-kinetic energy onset (secondary electron cutoff) in the UPS spectra.

After MoO$_3$ deposition, the VL shifted upward by 2.4 eV; that is, the work function increased from 4.4 eV (pristine graphene) to 6.8 eV (MoO$_3$-modified graphene). As discussed above, this shift in VL is due to the large work function difference between graphene and MoO$_3$ and the resulting p-type doping of the graphene. After exposure to air for 2 hours, the vacuum level shifted downward by 1.4 eV and the work function was reduced from 6.8 eV to 5.3 eV. This downward shift suggests that air exposure significantly degrades (i.e., reduces) the doping level of MoO$_3$ modified graphene devices, e.g., to a doping level of about 1×10$^{12}$ cm$^{-2}$. In some embodiments, encapsulating the MoO$_3$-modified graphene in an air impermeable surface encapsulation layer may enable higher hole concentrations to be achieved and maintained in air environments.

It is to be understood that the foregoing description is intended to illustrate and not to limit the scope of the invention, which is defined by the scope of the appended claims. Other embodiments are within the scope of the following claims.

What is claimed is:

1. An article comprising:
    a layer of graphene having a first work function;
    a metal oxide film disposed on the layer of graphene, the metal oxide film having a second work function greater than the first work function; and
    a source electrode and a drain electrode formed on the layer of graphene, the metal oxide film being between the source electrode and the drain electrode,
   whereby electrons are transferred from the layer of graphene to the metal oxide film, forming a hole accumulation layer in the layer of graphene.

2. The article of claim 1, wherein the hole accumulation layer has an areal density of holes of up to about 1.0×10$^{13}$ cm$^{-2}$.

3. The article of claim 1, further comprising a substrate, wherein the layer of graphene is disposed on the substrate.

4. The article of claim 3, wherein the layer of graphene is an epitaxial layer of graphene formed on the substrate.

5. The article of claim 3, wherein the substrate comprises an n-type material.

6. The article of claim 5, wherein the substrate comprises silicon carbide.

7. The article of claim 3, wherein the layer of graphene includes a first area and a second area adjacent to the first area; and wherein the metal oxide film is disposed only on the first area of the layer of graphene.

8. The article of claim 7, wherein a p-n junction is formed between the first area and the second area.

9. The article of claim 7, further comprising a first electrode in contact with the first area of the layer of graphene and a second electrode in contact with the second area of the layer of graphene.

10. The article of claim 1, wherein the metal oxide film comprises $MoO_3$.

11. The article of claim 1, wherein the metal oxide film comprises $WO_3$.

12. The article of claim 1, wherein the metal oxide film has a thickness of at least about 0.2 nm.

13. The article of claim 1, wherein the layer of graphene is ferromagnetic.

14. The article of claim 13, wherein the degree of magnetic hysteresis exhibited by the layer of graphene is dependent on the thickness of the metal oxide film.

15. The article of claim 13, wherein the metal oxide film has a thickness less than about 15 nm.

16. The article of claim 15, wherein the metal oxide film has a thickness of about 5 nm.

17. A method of doping graphene, the method comprising:
providing a layer of graphene having a first work function;
forming a metal oxide film on the layer of graphene, the metal oxide film having a second work function greater than the first work function; and
forming a source electrode and a drain electrode on the layer of graphene, the metal oxide film being between the source electrode and the drain electrode,
whereby electrons in the layer of graphene are transferred to the metal oxide film, forming a hole accumulation layer in the layer of graphene.

18. The method of claim 17, further comprising determining a thickness of the metal oxide film on the basis of a target concentration of holes in the hole accumulation layer.

19. The method of claim 17, wherein providing the layer of graphene includes forming the layer of graphene on a substrate.

20. The method of claim 19, wherein forming the layer of graphene on a substrate includes forming an epitaxial graphene film on the substrate.

21. The method of claim 19, wherein forming the layer of graphene on a substrate includes growing the layer of graphene by chemical vapor deposition.

22. The method of claim 17, wherein providing the layer of graphene includes forming the layer of graphene by micro-mechanical cleaving.

23. The method of claim 17, wherein providing the layer of graphene includes forming the layer of graphene by reducing a graphene oxide.

24. The method of claim 17, wherein forming the metal oxide film includes forming the metal oxide film by a vacuum thermal deposition process.

25. The method of claim 17, wherein forming the metal oxide film includes forming the metal oxide film by a layer-by-layer growth process.

26. A photodetector comprising:
a substrate;
a layer of graphene disposed on a surface of the substrate, the layer of graphene having a first work function;
a source electrode formed on the layer of graphene;
a drain electrode formed on the layer of graphene and separated from the source electrode; and
a metal oxide film disposed on the layer of graphene between the source electrode and the drain electrode, the metal oxide film having a second work function greater than the first work function,
whereby electrons are transferred from the layer of graphene to the metal oxide film, generating an intrinsic electric field near an interface between the layer of graphene and the metal oxide film.

27. The photodetector of claim 26, wherein a photocurrent is generated in the layer of graphene when incident photons are absorbed by the layer of graphene.

28. The photodetector of claim 27, wherein the graphene is configured to absorb photons having a frequency in the range from near-infrared to ultraviolet.

29. A device comprising:
a substrate;
a layer of graphene disposed on a surface of the substrate, the layer of graphene having a first work function, the layer of graphene having a first area and a second area adjacent to the first area;
a source electrode and a drain electrode formed on the layer of graphene; and
a metal oxide film being between the source electrode and the drain electrode, the metal oxide film disposed on the first area of the layer of graphene and having a second work function greater than the first work function, whereby a p-n junction is formed between the first area and the second area.

30. The device of claim 29, further comprising a first electrode in contact with the first area of the layer of graphene and a second electrode in contact with the second area of the layer of graphene.

31. The device of claim 29, wherein the substrate comprises n-type silicon carbide.

32. The device of claim 29, wherein electrons are transferred from the first area of the layer of graphene to the metal oxide film such that the first area is p-type.

33. The device of claim 29, wherein the second region of the layer of graphene is n-type.

34. The device of claim 33, wherein the second region of the layer of graphene is n-type due to charge transfer between the substrate and the second region of the layer of graphene.

* * * * *